United States Patent [19]

Pugel

[11] Patent Number: 4,956,710
[45] Date of Patent: Sep. 11, 1990

[54] TELEVISION RECEIVER TUNER HIGH PASS INPUT FILTER WITH CB TRAP

[75] Inventor: Michael A. Pugel, Indianapolis, Ind.

[73] Assignee: RCA Licensing Corporation, Princeton, N.J.

[21] Appl. No.: 339,575

[22] Filed: Apr. 14, 1989

[51] Int. Cl.$^5$ .............................................. H04B 1/16
[52] U.S. Cl. ..................... 358/188; 455/191; 455/286; 455/290; 333/175
[58] Field of Search ............... 455/191, 286, 290, 307, 455/339, 190; 358/198, 191.1; 333/174, 175, 185

[56] References Cited

U.S. PATENT DOCUMENTS

| | | | |
|---|---|---|---|
| 2,726,334 | 12/1955 | Chelgren et al. | 250/40 |
| 2,912,656 | 11/1959 | Waring | 333/175 |
| 3,111,636 | 11/1963 | Ma | 333/175 |
| 3,450,994 | 6/1969 | Arntsen et al. | 325/383 |
| 3,559,089 | 1/1971 | Wolf et al. | 330/31 |
| 3,852,670 | 12/1974 | Ma | 325/357 |
| 4,153,887 | 5/1979 | Poppa | 333/172 |
| 4,335,404 | 6/1982 | Martinson, Jr. | 358/188 |
| 4,361,909 | 11/1982 | Theriault | 455/286 |
| 4,395,778 | 7/1983 | Osada et al. | 455/286 X |
| 4,414,688 | 11/1983 | Hendricks et al. | 455/290 X |
| 4,584,544 | 4/1986 | Hettiger | 333/175 X |
| 4,601,062 | 7/1986 | Hettiger | 455/285 |
| 4,612,571 | 9/1986 | Moon | 358/86 |
| 4,642,691 | 2/1987 | Sakarya | 358/188 |
| 4,710,974 | 12/1987 | Kupfer | 455/190 |
| 4,748,667 | 5/1988 | Farmer et al. | 455/286 X |
| 4,756,024 | 7/1988 | Kupfer | 455/339 X |
| 4,760,325 | 7/1988 | Suzuki et al. | 358/191.1 |
| 4,771,332 | 9/1989 | Metoki | 455/191 |
| 4,876,739 | 10/1989 | Ma et al. | 333/175 |
| 4,888,568 | 12/1989 | Kawaguchi | 333/174 |

*Primary Examiner*—James J. Groody
*Assistant Examiner*—Mark R. Powell
*Attorney, Agent, or Firm*—Joseph S. Tripoli; Peter M. Emanuel; Frederick A. Wein

[57] ABSTRACT

The present invention is for a highpass input circuit for a television receiver having an additional trap at a predetermined frequency, e.g. CB frequencies. A M derived constant K high pass filter having an intermediate pi configured filter section is provided with an additional inductor in the shunt leg of the pi section for resonating with the bridge capacitance of the pi section and forming an additional trap at the predetermined frequency. The additional inductor is physically formed by an electrically conductive path etched on a printed circuit board.

5 Claims, 2 Drawing Sheets

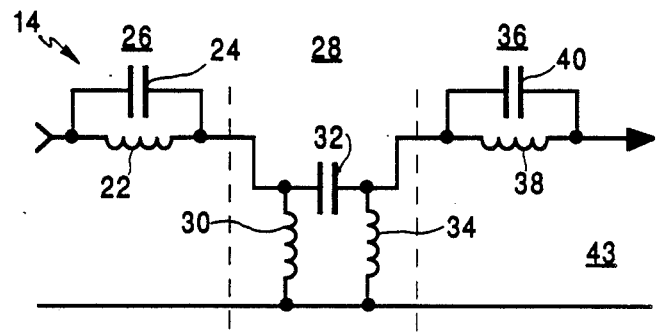
FIG. 2
PRIOR ART
FIG. 3
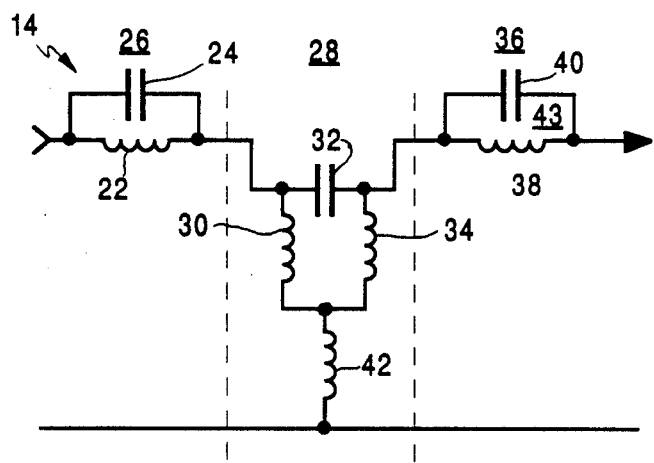

TELEVISION RECEIVER TUNER HIGH PASS INPUT FILTER WITH CB TRAP

The present invention concerns an input filter for processing radio frequency signals in a television receiver, and more particularly, to a m-derived constant k high pass filter having improved signal rejection at a predetermined frequency.

As used herein, the term television receiver includes without limitation apparatus independent of whether or not a display is provided, e.g. a television set and a VCR.

Television receivers often include an input highpass filter located between the television signal input of the receiver and the radio frequency (RF) signal processing stage of the receiver. The RF stage commonly includes frequency selection, amplifier and mixer stages which produce intermediate frequency (IF) output signals as known. The input filter prevents unwanted broadcast signal frequencies outside of the television frequency band, e.g. communications frequencies such as used by police, fire and citizens band broadcast and receiving systems, from reaching and interfering with the RF circuits of the television receiver. If such signals reach the mixer, they combine with the local oscillator signal to produce a difference frequency signal that can be a frequency within the IF frequency band and so appear in the IF output along with the desired signal The input filter also serves to prevent signal components associated with locally generated video IF and sound IF signal frequencies, e.g., generated in the mixing process with the local oscillator, from interfering with the input television signal to be processed by the RF stage, e.g., in a cable TV system from radiating out through the antenna terminals to interfere with other television receivers fed by the same amplifier output.

One example of an input filter of the type described above is shown in FIG. 2 and includes a pair of parallel resonant inductor-capacitor trap networks connected in series between the VHF television signal input of the receiver and the RF amplifier stage of the receiver with the two traps coupled by an intermediate pi configured M-derived constant K high pass filter section of two inductor legs to ground bridged by a capacitor. In the usual configuration, the pair of parallel resonant traps are tuned to predetermined frequencies of interest and the pi section provides high pass filtering above a predetermined corner frequency along with impedance matching between the pair of resonant traps.

One set of frequencies outside of the passband of particular concern for television receivers in the United States is the CB or citizen band frequencies at 27 MHz. Even though the CB transmitters are limited to a maximum of 5 watts of power into the output stage, since many of the systems are mobile, a CB transmitter can have a large effect on a television receiver due to the temporary but close proximity of the transmitter since a closely located CB transmitter can overload the input RF circuits of a television receiver Although the high pass filter of FIG. 2 discussed hereinabove does provide attenuation at the CB frequencies, when the transmitter is closely proximate it is desirable to provide even further attenuation of the CB band and that such attenuation be achievable in a most economical manner due to the highly competitive nature of the consumer electronics industry.

SUMMARY OF THE INVENTION

Briefly, the present invention is for a highpass input circuit for a television receiver having an additional trap at a predetermined frequency, e.g. CB frequencies. A M derived constant K high pass filter having an intermediate pi configured filter section is provided with an additional inductor in the shunt leg of the pi section for resonating with the bridge capacitance of the pi section and forming an additional trap at the predetermined frequency. The additional inductor is physically formed by an electrically conductive path etched on a printed circuit board.

DESCRIPTION OF THE DRAWINGS

For a better understanding of the present invention, reference may be had to the accompanying drawings wherein:

FIG. 2 is a schematic of an input filter of a tuner used in the prior art.

FIG. 3 is a schematic of the input filter according to the present invention.

DETAILED DESCRIPTION OF THE PREFERRED EMBODIMENT

Figure 1:
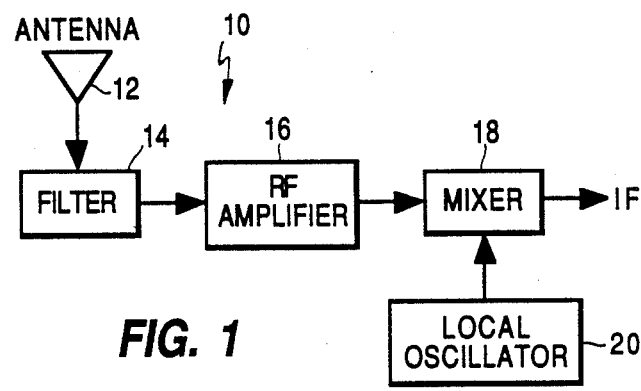
FIG. 1 is a block diagram representation of a portion of a television receiver tuner showing the filter of the present invention in relation to other tuner components.

Referring now to the drawings wherein like reference numerals have been applied to like members, there is shown in FIG. 1 a block diagram of an input section of a representative television receiver tuner generally designated 10. A signal is received from an exemplary antenna 12 or any other appropriate signal source such as cable TV or a VCR and is fed to filter 14 which is a modified M derived constant K high pass filter which attenuates undesired signals of frequencies (including CB at 27 MHz) below a cut-off frequency of 54 MHz, the lowest frequency of channel 2, and couples the remaining signals to RF amplifier 16 so that RF amplifier 16 receives only the television signal it was intended to process In turn, the signal is conveyed to mixer 18 which converts the received signal and a signal received from local oscillator 20 to a signal at a sum or difference intermediate frequency suitable for application to the following IF stages (not shown), said signal being afterwards coupled to detector circuits and other utilization circuits of the television receiver.

Referring now to FIGS. 2 and 3, filter 14 includes a parallel resonant inductor (L) 22 and capacitor (C) 24 forming an input filter section 26 in series with the signal path and resonant at one of 44 MHz and 41.25 MHz which are the video and sound IF carrier frequencies respectively. Input filter section 26 forms a series trap to prevent IF signal components generated by the mixer 18 with local oscillator 20 from interfering with television signals supplied by source 12 particularly if source 12 is a cable TV system.

An intermediate filter section 28 is pi configured and includes an inductor 30 shunting the signal path, a series capacitor 32 in the signal path, and a shunting inductor 34 with the values of capacitor 32 and inductors 30 and 34 chosen according to M derived constant K filter network calculations for establishing the corner frequency of about 52 MHz.

High pass filtered signals from intermediate filter section 28 are coupled into an output filter section 36 including an inductor (L) 38 in parallel with capacitor 40 forming parallel resonant circuit 42 in series with the signal path. Output filter section 36 is tuned to the other one of the carrier frequencies for the same reasons as input filter section 26. In the prior art circuit of FIG. 2, inductors 30 and 34 are typically 163 nanohenries (nHy) and capacitor 32 is 18 picofarads (pf).

In accord with the present invention, inductor 42 is added to the ground legs of each of inductors 30 and 34. It has been found that by addition of inductor 42 an additional CB (or other appropriate) trap can be added without requiring the purchase and insertion of additional circuit components onto the printed circuit board and without degrading the functioning of input filter 14 as discussed hereinabove. According to the present invention, inductor 42 resonates with capacitor 32 at the trap frequency and provides an improved attenuation at the desired trap frequency. With inductor 42 in the circuit, the inductive value of inductor 42 is added to the inductive value of inductors 30 and 32. Thus, the value of inductor 42 of 13 nHy is subtracted from the inductive value of inductors 30 and 34 nominally 163 nHy in FIG. 2 and changed to 150 nHy in FIG. 3.

Figure 4:
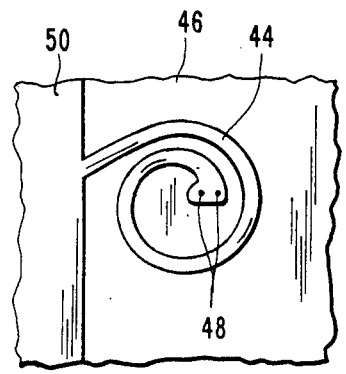
FIG. 4 is a partial bottom view of a printed circuit board according to an aspect of the present invention.

The inductive value of inductor 42 can easily be achieved with an appropriate number of involuted spiral turns formed by an electrically conductive etched path on a printed circuit board in a manner well known in the art. FIG. 4 shows such a printed circuit arrangement wherein an exemplary spiral etched copper printed circuit path 44 is formed on printed circuit board substrate 46. A spiral is most preferred because it maximizes the coupling of the fields generated by the current through the conductors with respect to space and distance.

The ground legs of inductors 30 and 34 can be inserted and soldered at apertures 48 and connected to electrical ground such as a ground plane 50 through spiral path 44. As is well known, the spiral conductor path 44 forms a coil of small inductance instead of requiring the addition of an externally applied wire form which would then have to be inserted and wired onto the board with additional purchase cost and assembly operations. Since the printed circuit board 46 is to be etched anyway, the value of inductor 42 is achieved without extra component cost thus forming an additional trap at an unwanted frequency without interfering with the other required functions of input filter 14.

While there has been illustrated and described what is at present considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed is:

1. In a television receiver, a television signal processing system for highpass filtering the television signal comprising:
   an LC parallel resonant input filter section in series with and having an input for receiving said signal,
   an LC parallel resonant output filter section in series with and having an output of a highpass filtered version of said signal, and
   a generally pi configured intermediate filter section with an input terminal for receiving said signal from said input filter section and an output terminal for conveying said signal to said output section, said intermediate section comprising a capacitor coupled between the input terminal and the output terminal, a first and a second inductor each coupled from one of the terminals to a common junction, and a third inductor coupled from the common junction to a signal ground.

2. The processing system of claim 1 wherein the input filter section resonates at a first frequency, the output filter section resonates at a second frequency, and the capacitor and the third inductor resonate at a third frequency.

3. The processing system of claim 2 wherein the third inductor is formed by an electrically conductive path etched on a printed circuit board.

4. The processing system of claim 2 wherein the third frequency is within a citizens band frequency allocation.

5. The processing system of claim 1 wherein the input filter section, the output filter section, and the intermediate filter section comprise an m derived constant k configuration.

* * * * *